(12) United States Patent
Arai et al.

(10) Patent No.: US 6,399,222 B2
(45) Date of Patent: *Jun. 4, 2002

(54) ORGANIC ELECTROLUMINESCENT DEVICE

(75) Inventors: Michio Arai; Hiroshi Yamamoto, both of Tokyo (JP)

(73) Assignee: TDK Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/212,408

(22) Filed: Dec. 16, 1998

(30) Foreign Application Priority Data

Dec. 27, 1997 (JP) .............................. 9-368031

(51) Int. Cl.$^7$ .............................................. H05B 33/22
(52) U.S. Cl. .................. 428/690; 428/917; 313/504; 313/506
(58) Field of Search ................. 428/690, 917, 428/428; 313/504, 506

(56) References Cited

U.S. PATENT DOCUMENTS

| | | | | | |
|---|---|---|---|---|---|
| 4,835,061 A | * | 5/1989 | Ohta et al. | ................ | 428/469 |
| 5,034,795 A | * | 7/1991 | Henry | ..................... | 357/30 |
| 5,409,783 A | * | 4/1995 | Tang et al. | ................. | 428/690 |
| 5,512,215 A | * | 4/1996 | Tachizono et al. | ......... | 252/584 |
| 5,642,213 A | * | 6/1997 | Mase et al. | .................... | 349/43 |
| 5,648,172 A | * | 7/1997 | Jousse et al. | ............... | 428/426 |
| 5,869,929 A | * | 2/1999 | Eida et al. | ................... | 313/501 |
| 5,909,081 A | * | 6/1999 | Eida et al. | ................... | 313/504 |
| 5,952,779 A | * | 9/1999 | Arai et al. | .................... | 313/504 |
| 5,969,474 A | * | 10/1999 | Arai | ........................... | 313/504 |
| 5,981,092 A | * | 11/1999 | Arai et al. | ................... | 428/690 |

FOREIGN PATENT DOCUMENTS

| JP | 52-122092 | | 10/1977 |
|---|---|---|---|
| JP | 07014678 A | * | 1/1995 |

* cited by examiner

Primary Examiner—Cynthia H. Kelly
Assistant Examiner—Dawn L. Garrett
(74) Attorney, Agent, or Firm—Oblon, Spivak, McClelland, Maier & Neustadt, P.C.

(57) ABSTRACT

An organic EL device includes a substrate, an organic EL structure, and a barrier layer therebetween. The substrate is of alkali glass. The barrier layer is of silicon oxide. The device has advantages including retarded occurrence of dark spots, improved storage stability and durability, and reduced expense of manufacture.

7 Claims, 1 Drawing Sheet

ORGANIC ELECTROLUMINESCENT DEVICE

This invention relates to an organic electroluminescent (EL) device using an organic compound and more particularly, to an organic EL device having a barrier layer between a substrate and an organic EL structure.

BACKGROUND OF THE INVENTION

Recently, active research works have been made on organic EL devices. As a basic configuration, the organic EL device includes a hole injecting electrode of tin-doped indium oxide (ITO) etc., a thin film formed thereon by depositing a hole transporting material such as triphenyldiamine (TPD), a light emitting layer deposited thereon of a fluorescent material such as an aluminum quinolinol complex (Alq3), and a metal electrode or electron injecting electrode formed thereon from a metal having a low work function such as magnesium. Such organic EL devices are attractive in that they can achieve a very high luminance ranging from several 100 to several 10,000 $cd/m^2$ with a drive voltage of approximately 10 volts.

The organic EL devices sometimes suffer from a decline of luminance with the lapse of driving time, abnormal light emission due to current leakage, and a phenomenon of generating and propagating non-luminous regions known as dark spots. As dark spots propagate and the abnormal light emission worsens, the devices can deteriorate to a practically unacceptable level. Also, the organic EL devices are quite vulnerable to moisture. Penetration of moisture can cause separation between the light emitting layer and the electrode layer or alter the properties of the constituent materials, also creating dark spots and failing to maintain light emission of the desired quality. It is then an important task to prevent the occurrence of defects and the deterioration of device characteristics.

One factor that causes deterioration of the organic EL device is impurities in substrate glass such as sodium and potassium which migrate and diffuse from the substrate to the hole injecting electrode. A common solution to this problem is to use alkali-free glass, which is expensive. It is commercially advantageous if inexpensive alkali glass can be used.

SUMMARY OF THE INVENTION

An object of the present invention is to provide an organic EL device which has advantages including minimized occurrence of abnormal light emission and dark spots, improved storage life and durability and which can be manufactured at a low cost.

According to the invention, there is provided an organic electroluminescent (EL) device comprising a substrate of alkali glass, an organic EL structure on the substrate, and a barrier layer between the substrate and the organic EL structure, the barrier layer containing silicon oxide.

In preferred embodiments, the barrier layer has a refractive index of 1.40 to 1.55 at a wavelength of 632 nm; the barrier layer consists essentially of silicon oxide which is represented by SiOx wherein x is from 1.8 to 2.2; the barrier layer is formed by sputtering, especially to a thickness of 5 to 50 nm and a mean surface roughness (Ra) of 2 to 50 nm.

In further preferred embodiments, the substrate contains 10 to 30% by weight, calculated as $Na_2O$ and $K_2O$, of sodium or potassium or a mixture of sodium and potassium; the substrate has a mean surface roughness (Ra) of 2 to 50 nm; the substrate has been mirror polished.

BRIEF DESCRIPTION OF THE DRAWINGS

The only FIGURE.

BEST MODE FOR CARRYING OUT THE INVENTION

Figure 1:
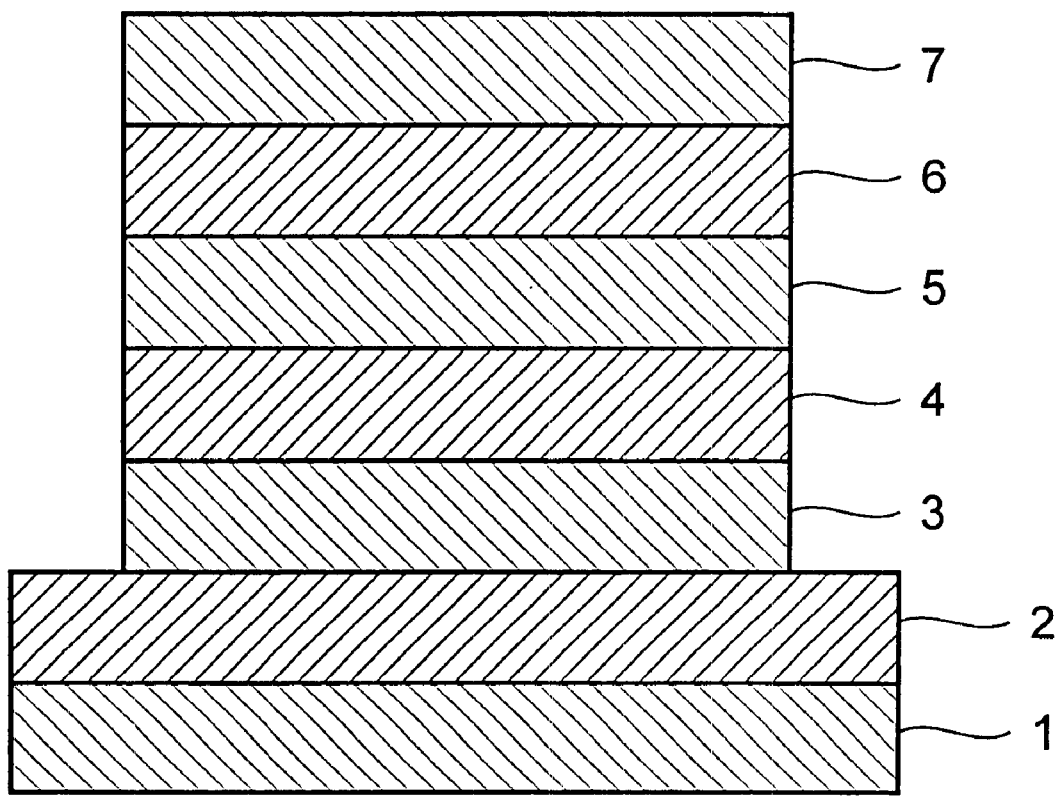
FIG. 1 is a schematic view illustrating one exemplary construction of an organic EL device according to the invention.

The organic EL device of the present invention has a barrier layer between a glass substrate and an organic EL structure, the barrier layer containing silicon oxide SiOx.
Barrier Layer The barrier layer containing SiOx is in passivated form which is effective for preventing migration of impurities in the substrate glass such as sodium and potassium. By preventing sodium, potassium and other impurities in the substrate from diffusing into the hole injecting electrode, the device is improved in storage life and durability.

Although organic EL devices are vulnerable to moisture, the barrier layer containing SiOx is effective for protecting the organic EL structure from the ambient atmosphere and moisture, also contributing to the improvements in storage life and durability.

The barrier layer preferably has a refractive index of 1.40 to 1.55, more preferably 1.44 to 1.48 at a wavelength of 632 nm. Outside this range, a layer with a higher refractive index would become a weak barrier to alkali metals such as sodium and potassium whereas a layer with a lower refractive index would becomes a weak barrier to moisture.

In addition to SiOx, the barrier layer may contain N, C, Ar, etc. as incidental impurities in an amount of up to 0.5% by weight.

When silicon oxide is represented by SiOx, x preferably ranges from 1.8 to 2.2, more preferably from 1.90 to 2.05. As long as x has a value in this range as an average throughout the barrier layer, the value of x may have a gradation in a thickness direction.

Further preferably, the barrier layer has a transmittance of at least 90% of emitted light. A barrier layer with a lower transmittance would attenuate the light emitted from the light emitting layer to below the luminance level necessary as a light emitting device.

The thickness of the barrier layer is not particularly limited as long as the above preferred parameters are met. Preferably the barrier layer is about 5 to 50 nm thick, more preferably about 10 to 30 nm thick.

The barrier layer containing SiOx can be formed by plasma chemical vapor deposition (CVD) and other processes although sputtering is the most preferred process. In forming a film having the above-described attributes, RF sputtering using an RF power supply is preferable. The plasma CVD process has the risk that hydrogen is introduced from reactive gases into the film, deteriorating the barrier properties of the film against moisture.

When the barrier layer is formed by sputtering, the sputtering gas may be any of inert gases used in conventional sputtering equipment. In particular, Ar, Kr, or Xe or a gas mixture containing at least one of these rare gases is preferred.

Ar, Kr, and Xe are preferred because they are inert gases and have a relatively high atomic weight. When Ar, Kr or Xe gas is used, the sputtered atoms perform repetitive collisions with the gas and reduce their kinetic energy until they arrive at the substrate. This restrains grain growth and insures a smooth surface to the film.

When Ar, Kr or Xe is used as the main sputtering gas, the product of the substrate-to-target distance multiplied by the pressure is preferably in the range of 20 to 60 Pa·cm, especially 30 to 50 Pa·cm. Within this range, better results are obtained independent of the identity of the sputtering gas selected from Ar, Kr and Xe. Use of Ar is especially preferred.

To compensate for oxygen defects, oxygen gas such as $O_2$ may be mixed with the sputtering gas. Oxygen gas is preferably introduced so as to give a partial pressure of about 0.1% to about 100% of the sputtering gas. Even when oxygen gas is introduced under an equal partial pressure, the quantity of oxygen taken into the barrier layer differs depending on the substrate temperature, sputtering gas pressure, target-to-substrate distance, input power and other conditions. Then the partial pressure of oxygen gas may be adjusted as appropriate in accordance with these conditions.

The sputtering process is preferably RF sputtering. The power of the RF sputtering equipment is preferably in the range of about 10 to about 100 $W/cm^2$. The selected frequency is 13.56 MHz. The deposition rate is preferably in the range of about 5 to about 50 nm/min. An appropriate operating pressure is in the range of 0.1 to 1 Pa.

The barrier layer on its surface (or interface with the hole injecting electrode) preferably has a mean surface roughness (Ra) of 2 to 50 nm. If the barrier layer surface loses flatness, such an irregular surface can cause generation of current leakage and dark spots. On this account, it is preferable to control the mean surface roughness (Ra) of the barrier layer at the interface with the hole injecting electrode so as to fall in the above range, by selecting appropriate deposition conditions for suppressing abnormal grain growth.

Substrate

The substrate is a flat plate of alkali glass having a certain strength which is easy to handle, readily available, and inexpensive. Since the SiOx-containing barrier layer prevents diffusion of Na, K and other undesirable elements from the substrate into the hole injecting electrode, the substrate glass may contain about 10% to 30% by weight, calculated as $Na_2O$ and $K_2O$, of sodium or potassium or a mixture of sodium and potassium. Such alkali glass is commercially advantageous since it is less expensive than alkali-free glass conventionally employed as the substrate. The content of silicon oxide in glass is preferably 55% to 80% by weight calculated as $SiO_2$. Additionally, the glass may contain divalent metal oxides such as calcium oxide and magnesium oxide, aluminum oxide, boron oxide, and phosphorus oxide in amounts of up to 35% by weight, calculated as CaO, MgO, $Al_2O_3$, $B_2O_3$, and $P_2O_5$, respectively.

The thickness of the substrate is not critical and may be determined in accordance with the necessary strength, transparency, display size, and the presence or absence of a filter. Usually the substrate is about 0.3 to about 20 mm thick, preferably about 0.5 to about 10 mm thick.

Preferably, the substrate has a mean surface roughness (Ra) of 2 to 50 nm. If the substrate surface loses flatness, there is a likelihood of inducing current leakage and dark spots. Then the substrate at the surface is mirror polished with abrasives of diamond or cerium oxide so that the mean surface roughness (Ra) may fall in the above range.

Referring to FIG. 1, there is illustrated one exemplary construction of the organic EL device of the invention. The EL device shown in FIG. 1 includes a substrate 1 and has a barrier layer 2, an anode 3, a hole injecting and transporting layer 4, a light emitting layer 5, an electron injecting and transporting layer 6, and a cathode 7 arranged on the substrate 1 in the described order.

Organic EL Structure

Now the organic EL structure included in the organic EL device of the invention is described.

The organic EL structure is situated on the substrate and includes a hole injecting electrode, an electron injecting electrode, and at least one organic layer disposed between these electrodes. The at least one organic layer includes at least one hole transporting layer and at least one light emitting layer, on which the electron injecting electrode is situated. A protective electrode may be provided as the uppermost layer. The hole transporting layer may be omitted. The electron injecting electrode is constructed of a metal, compound or alloy having a low work function by evaporation or sputtering, preferably by sputtering.

A transparent electrode is preferred as the hole injecting electrode because a structure allowing emitted light to exit from the substrate side is typical. Useful materials include tin-doped indium oxide (ITO), zinc-doped indium oxide (IZO), zinc oxide (ZnO), tin oxide ($SnO_2$), and indium oxide ($In_2O_3$), with ITO and IZO being preferred. For ITO, an appropriate proportion of $SnO_2$ mixed with $In_2O_3$ is about 1 to 20%, more preferably about 5 to 12% by weight. For IZO, an appropriate proportion of ZnO mixed with $In_2O_3$ is about 1 to 20%, more preferably about 5 to 12% by weight. Additionally, Sn, Ti, Pb and so forth may be contained in oxide form in an amount of up to 1% by weight calculated as oxide.

Although the hole injecting electrode can be formed by evaporation and other processes, sputtering is the preferred process. Where an ITO or IZO electrode is formed by sputtering, a target of $In_2O_3$ doped with $SnO_2$ or ZnO is preferably used. A transparent ITO electrode formed by sputtering experiences a less change with time of luminance than an ITO electrode formed by evaporation. The preferred sputtering process is dc sputtering. The input power is preferably in the range of about 0.1 to about 4 $W/cm^2$. In particular, the preferred input power of the dc sputtering equipment is in the range of about 0.1 to about 10 $W/cm^2$, more preferably 0.2 to 5 $W/cm^2$. The deposition rate is preferably in the range of about 2 to about 100 nm/min., especially about 5 to about 50 nm/min.

The sputtering gas may be any of inert gases used in conventional sputtering equipment, for example, Ar, He, Ne, Kr, Xe, and mixtures of such inert gases. The sputtering gas is kept under a pressure of about 0.1 to about 20 Pa during sputtering.

The hole injecting electrode should have a sufficient thickness for hole injection and is preferably about 5 to about 500 nm thick, especially about 10 to 300 nm thick.

The electron injecting electrode is preferably formed from materials having a low work function for effective electron injection. Exemplary materials include metal elements such as K, Li, Na, Mg, La, Ce, Ca, Sr, Ba, Al, Ag, In, Sn, Zn, Zr, Cs, Er, Eu, Ga, Hf, Nd, Rb, Sc, Sm, Ta, Y, and Yb, and compounds such as BaO, BaS, CaO, HfC, $LaB_6$, MgO, MoC, NbC, PbS, SrO, TaC, ThC, $ThO_2$, ThS, TiC, TiN, UC, UN, $UO_2$, $W_2C$, $Y_2O_3$, ZrC, ZrN, and $ZrO_2$. Binary or ternary alloys made of two or three metal elements are useful for stability improvement. Exemplary alloys are aluminum base alloys such as Al—Ca (Ca: 5 to 20 at %), Al—In (In: 1 to 10 at %), Al—Li (Li: 0.1 to less than 20 at %), and Al—R wherein R is Y, Sc or rare earth element, and In—Mg (Mg: 50 to 80 at %). Of these, elemental aluminum and aluminum alloys such as Al—Li (Li: 0.4 to less than 6.5 at % or Li: 6.5 to 14 at %) and Al—R (R: 0.1 to 25 at %, especially 0.5 to 20 at %) are preferable because they are relatively free from compression stresses. Then, for sputtering, targets of such electron injecting electrode-forming metals or alloys are used. These materials should preferably have a work function of up to 4.5 eV, with metals and alloys having a work function of up to 4.0 eV being especially preferred.

The use of the sputtering process in forming the electron injecting electrode has several advantages. The electron injecting electrode film formed by the sputtering process is improved in adhesion at the interface with the organic layer because as compared with the evaporation process, the sputtered atoms and atomic groups acquire relatively high kinetic energy so that the surface migration effect may occur. Also, since the surface oxide layer can be removed in vacuum by effecting pre-sputtering or the moisture and oxygen which have adsorbed on the organic layer interface can be removed by effecting back sputtering, it is possible to form a clean electrode-organic layer interface and a clean electrode and eventually, to fabricate an organic EL device of quality and stable performance. Alloys within the above-defined compositional range or elemental metals may be used as the target while targets of such alloys or metals with any desired component added are also acceptable. Further, even when a mixture of materials having significantly different vapor pressures is used as the target, there occurs only a slight shift in composition between the target and the film deposited therefrom, which eliminates the limits that are imposed on the materials by the vapor pressure or the like in the case of the evaporation process. The sputtering process is also advantageous in productivity as compared with the evaporation process, because it is unnecessary to supply the material for a long period of time and the resulting film is well uniform in thickness and quality.

Since the electron injecting electrode formed by the sputtering process is a dense film which minimizes the ingress of moisture as compared with an evaporated film of sparse packing, there can be obtained an organic EL device having high chemical stability and a long lifetime.

The pressure of the sputtering gas during sputtering is preferably in the range of 0.1 to 5 Pa. By controlling the pressure of the sputtering gas within this range, an Al—Li alloy having a lithium concentration within the above-defined range can be easily obtained. Also, by changing the pressure of the sputtering gas within this range during film deposition, an electron injecting electrode having a graded lithium concentration as described above can be easily obtained. Furthermore, deposition conditions are preferably controlled such that the product of the substrate-to-target distance multiplied by the pressure of the sputtering gas may fall in the range of 20 to 65 Pa·cm.

The sputtering gas may be an inert gas as used in conventional sputtering apparatus, and in the case of reactive sputtering, a reactive gas such as $N_2$, $H_2$, $O_2$, $C_2H_4$ or $NH_3$ may be used in addition to the inert gas.

The sputtering process may be a high-frequency sputtering process using an RF power supply although a dc sputtering process is preferably used because the rate of film deposition is easily controllable and for the purpose of minimizing the damage to the organic EL device structure. The power to the dc sputtering apparatus is preferably in the range of about 0.1 to 10 $W/cm^2$, especially about 0.5 to 7 $W/cm^2$. Also, the rate of film deposition is preferably in the range of about 5 to 100 nm/min., especially about 10 to 50 nm/min.

The electron injecting electrode thin film should have a sufficient thickness for electron injection, typically at least 1 nm, preferably at least 3 nm. The upper limit of thickness is not critical although the film thickness generally ranges from about 3 nm to about 500 nm.

The organic EL device of the invention may include a protective electrode on the electron injecting electrode, that is, on the surface of the electron injecting electrode which is situated remote from the organic layer. The provision of the protective electrode is effective for protecting the electron injecting electrode from the surrounding atmosphere and moisture, preventing the thin films from deterioration, stabilizing the efficiency of electron injection, and remarkably increasing the lifetime of the device. The protective electrode has a very low resistivity so that it may serve as a wiring electrode in case the electron injecting electrode has a high resistivity. This protective electrode contains at least one of aluminum, a mixture of aluminum and a transition metal (excluding titanium), titanium and titanium nitride (TiN). When these components are used alone, it is preferred that the protective electrode contain about 90 to 100 at % of Al, about 90 to 100 at % of Ti or about 90 to 100 mol % of TiN. When a mixture of two or more components is used, the mix ratio of the components is not critical. When a mixture of aluminum and titanium is used, the mixture preferably contains up to 10 at % of Ti. Alternatively, layers each composed of a single component are laid up. In particular, aluminum or a mixture of aluminum and a transition metal gives better results when used as the wiring electrode as will be described later; and titanium nitride is well corrosion resistant and thus effective as a sealing film. Titanium nitride (TiN) may deviate about 10% from its stoichiometry. The alloys of aluminum and a transition metal may contain transition metals such as Sc, Nb, Zr, Hf, Nd, Ta, Cu, Si, Cr, Mo, Mn, Ni, Pd, Pt and W, preferably in a total amount of up to 10 at %, more preferably up to 5 at %, and most preferably up to 2 at %. The lower the content of transition metal, the lower becomes the thin film resistance when the electrode serves as a wiring conductor.

The protective electrode has a thickness sufficient to ensure efficient electron injection and prevent ingress of moisture, oxygen and organic solvents, preferably a thickness of at least 50 nm, more preferably at least 100 nm, and especially 100 to 1,000 nm. Too thin a protective electrode layer would fail to achieve the above effects or to provide step coverage so that its connection to a terminal electrode becomes insufficient. Too thick a protective electrode layer would accumulate more stresses, resulting in an increased growth rate of dark spots. In the embodiment wherein the protective electrode serves as the wiring electrode, the thickness of the protective electrode is usually about 100 to 500 nm when the electron injecting electrode is thin and has a high film resistance and the protective electrode must compensate for that film resistance, and otherwise about 100 to 300 nm.

The total thickness of the electron injecting electrode and the protective electrode combined is preferably about 100 to 1,000 nm though not critical.

Following the electrode formation, a protective film may be formed in addition to the protective electrode, using an inorganic material such as SiOx or an organic material such as Teflon and chlorine-containing fluorinated hydrocarbon polymers. The protective film may be either transparent or opaque and have a thickness of about 50 to 1,200 nm. Apart from the reactive sputtering process mentioned above, the protective film may also be formed by an ordinary sputtering, evaporation or PECVD process.

Further preferably, a sealing layer may be provided on the device in order to prevent the organic layers and electrodes from oxidation. In order to prevent the ingress of moisture, the sealing layer is formed by attaching a shield plate to the substrate through an adhesive resin layer for sealing. The sealing gas is preferably an inert gas such as argon, helium, and nitrogen. The sealing gas should preferably have a moisture content of less than 100 ppm, more preferably less than 10 ppm, especially less than 1 ppm. The lower limit of the moisture content is usually about 0.1 ppm though not critical. The containment of the sealing gas is effective for restraining deterioration of the hole injecting electrode, organic layers, electron injecting electrode of the organic EL structure themselves and at their interface through chemical reaction with moisture and hence, for maintaining the initial performance.

The shield plate is selected from plates of transparent or translucent materials such as glass, quartz and resins, with glass being especially preferred. Alkali glass is preferred although other glass compositions such as soda lime glass, lead alkali glass, borosilicate glass, aluminosilicate glass, and silica glass are also useful. Such glass plates are preferably prepared by the roll-out, down-draw, fusion or float method. Glass plates are often subject to surface treatment, preferably polishing or $SiO_2$ barrier coating. Of these, plates of soda lime glass prepared by the float method are inexpensive and useful without surface treatment. Metal plates and plastic plates may also be used as the shield plate.

A spacer is preferably used as means for adjusting the height of the shield plate although the height adjusting means is not limited thereto. The spacer is an inexpensive and simple height adjusting means for holding the shield plate at a desired height over the layer structure. The spacer may be formed from resin beads, silica beads, glass beads, and glass fibers, with the glass beads being especially preferred. Usually the spacer is formed from particles having a narrow particle size distribution while the shape of particles is not critical. Particles of any shape which does not obstruct the spacer function may be used. Preferred particles have an equivalent circle diameter of about 1 to 20 $\mu$m, more preferably about 1 to 10 $\mu$m, most preferably about 2 to 8 $\mu$m. Particles of such diameter should preferably have a length of less than about 100 $\mu$m, with the lower limit of length being usually about 1 $\mu$m though not critical.

When a shield plate having a recess is used, the spacer may be used or not. When used, the spacer should preferably have a diameter in the above-described range, especially 2 to 8 $\mu$m.

The spacer may be premixed in a sealing adhesive or mixed with a sealing adhesive at the time of bonding. The content of the spacer in the sealing adhesive is preferably 0.01 to 30% by weight, more preferably 0.1 to 5% by weight.

Any of adhesives which can maintain stable bond strength and gas tightness may be used although UV curable epoxy resin adhesives of cation curing type are preferred. Since layer-forming materials of the organic EL multilayer structure usually have a glass transition temperature of at most about 140° C., typically from about 80° C. to about 100° C., the use of conventional thermosetting adhesives having a curing temperature of about 140° C. to about 180° C. gives rise to the problem that upon curing of the adhesive, the organic EL multilayer structure can soften and deteriorate its characteristics. In contrast, UV-curing adhesives do not give rise to the problem that the organic EL multilayer structure can soften. However, the currently available UV-curing adhesives yet have the problem that since they are acrylic base adhesives, acrylic monomers can volatilize upon curing of the adhesive, which adversely affects the layer-forming materials of the organic EL multilayer structure to deteriorate their characteristics. Therefore, use of a UV-curing epoxy resin adhesive of the cationic curing type is recommended since it eliminates or minimizes the above-described problems.

It is noted that UV-curing/thermosetting combined type epoxy resin adhesives are encompassed in commercially available UV-curing epoxy resin adhesives. Since most of these adhesives are obtained by the mixing or modification of acrylic resins of the radical curing type with epoxy resins of the thermosetting type, they have not solved the acrylic monomer volatilization problem of acrylic resins and the curing temperature problem of thermosetting epoxy resins. Then, the UV-curing/thermosetting combined type epoxy resin adhesives are not desirable as the adhesive for use in the organic EL devices of the invention.

The UV-curing epoxy resin adhesive of the cationic curing type, as used herein, is an adhesive composition comprising an epoxy resin as a base component and a Lewis acid salt type curing agent as a main curing agent which upon exposure to light containing UV radiation, releases a Lewis acid catalyst through photolysis whereby the epoxy resin polymerizes and cures through a reaction mechanism of cationic polymerization type. The epoxy resins used as the base component of the adhesive include epoxidized olefinic resins, alicyclic epoxy resins, and novolak epoxy resins. Examples of the curing agent include Lewis acid salts of aromatic diazonium, Lewis acid salts of diallyl iodonium, Lewis acid salts of triallyl sulfonium, and Lewis acid salts of triallyl selenium.

The amount of the adhesive coated is usually about 1 to 100 mg/cm$^2$, preferably about 1 to 10 mg/cm$^2$, though it varies with the size of spacer used.

The thickness of the adhesive layer corresponds to the height where the shield plate is positioned, that is the thickness of the organic EL structure plus the distance of the desired space maintained above the organic EL structure. The thickness of the adhesive layer is usually about 500 to 1 $\mu$m, preferably about 20 to 2 $\mu$m, though not critical.

Next, the organic material layers included in the organic EL device of the invention are described.

The light emitting layer has the functions of injecting holes and electrons, transporting them, and recombining holes and electrons to create excitons. It is preferred that relatively electronically neutral compounds be used in the light emitting layer.

The hole injecting and transporting layer has the functions of facilitating injection of holes from the hole injecting electrode, transporting holes stably, and obstructing electron transportation. The electron injecting and transporting layer has the functions of facilitating injection of electrons from the electron injecting electrode, transporting electrons stably, and obstructing hole transportation. These layers are effective for increasing the number of holes and electrons injected into the light emitting layer and confining holes and electrons therein for optimizing the recombination region to improve light emission efficiency.

The thicknesses of the light emitting layer, the hole injecting and transporting layer, and the electron injecting and transporting layer are not critical and vary with a particular formation technique although their thickness is usually preferred to range from about 5 nm to about 500 nm, especially about 10 nm to about 300 nm.

The thickness of the hole injecting and transporting layer and the electron injecting and transporting layer is equal to or ranges from about 1/10 times to about 10 times the thickness of the light emitting layer although it depends on the design of a recombination/light emitting region. When the electron or hole injecting and transporting layer is divided into an injecting layer and a transporting layer, preferably the injecting layer is at least 1 nm thick and the transporting layer is at least 1 nm thick. The upper limit of thickness is usually about 500 nm for the injecting layer and about 500 nm for the transporting layer. The same film thickness applies when two injecting/transporting layers are provided.

The light emitting layer of the organic EL device of the invention contains a fluorescent material that is a compound having a light emitting capability. The fluorescent material may be at least one member selected from compounds as disclosed, for example, in JP-A 264692/1988, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are phenylanthracene derivatives described in JP-A 12600/1996 and the tetraarylethene derivatives described in JP-A 12969/1996.

It is preferred to use such a compound in combination with a host material capable of light emission by itself, that is, to use the compound as a dopant. In this embodiment, the content of the compound in the light emitting layer is preferably 0.01 to 10% by weight, especially 0.1 to 5% by weight. By using the compound in combination with the host material, the light emission wavelength of the host material can be altered, allowing light emission to be shifted to a longer wavelength and improving the luminous efficacy and stability of the device.

As the host material, quinolinolato complexes are preferable, with aluminum complexes having 8-quinolinol or a derivative thereof as the ligand being more preferable. These aluminum complexes are disclosed in JP-A 264692/1988, 255190/1991, 70733/1993, 258859/1993 and 215874/1994.

Illustrative examples include tris(8-quinolinolato)-aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato) (phenolato)-aluminum(III), bis(2-methyl-8-quinolinolato) (ortho-cresolato)aluminum(III), bis(2-methyl-8-quinolinolato)(meta-cresolato)aluminum(III), bis(2-methyl-8-quinolinolato)(para-cresolato)aluminum(III), bis(2-methyl-8-quinolinolato)-(ortho-phenylphenolato)aluminum (III), bis(2-methyl-8-quinolinolato)(meta-phenylphenolato) aluminum(III), bis(2-methyl-8-quinolinolato)(para-phenylphenolato)aluminum(III), bis(2-methyl-8-quinolinolato)(2,3-dimethylphenolato)-aluminum(III), bis (2-methyl-8-quinolinolato)(2,6-dimethylphenolato) aluminum(III), bis(2-methyl-8-quinolinolato)(3,4-dimethylphenolato)aluminum(III), bis(2-methyl-8-quinolinolato)(3,5-dimethylphenolato)aluminum(III), bis(2-methyl-8-quinolinolato)(3,5-di-tert-butylphenolato)-aluminum(III), bis(2-methyl-8-quinolinolato)(2,6-diphenylphenolato)aluminum(III), bis(2-methyl-8-quinolinolato)-(2,4,6-triphenylphenolato)aluminum(III), bis (2-methyl-8-quinolinolato)(2,3,6-trimethylphenolato) aluminum(III), bis(2-methyl-8-quinolinolato)(2,3,5,6-tetramethylphenolato)-aluminum(III), bis(2-methyl-8-quinolinolato)(1-naphtholato)-aluminum(III), bis(2-methyl-8-quinolinolato)(2-naphtholato)-aluminum(III), bis(2,4-dimethyl-8-quinolinolato)(ortho-phenylphenolato) aluminum(III), bis(2,4-dimethyl-8-quinolinolato)(para-phenylphenolato)aluminum(III), bis(2,4-dimethyl-8-quinolinolato)(meta-phenylphenolato)-aluminum(III), bis (2,4-dimethyl-8-quinolinolato)(3,5-dimethylphenolato) aluminum(III), bis(2,4-dimethyl-8-quinolinolato)(3,5-di-tert-butylphenolato)aluminum(III), bis(2-methyl-4-ethyl-8-quinolinolato)(para-cresolato)-aluminum(III), bis(2-methyl-4-methoxy-8-quinolinolato)(para-phenylphenolato) aluminum(III), bis(2-methyl-5-cyano-8-quinolinolato) (ortho-cresolato)aluminum(III), and bis(2 -methyl-6-trifluoromethyl-8-quinolinolato)(2-naphtholato)-aluminum (III).

Also acceptable are bis(2-methyl-8-quinolinolato)-aluminum(III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum(III)-$\mu$-oxo-bis(4-ethyl-2-methyl-8-quinolinolato)aluminum(III), bis(2-methyl-4-methoxyquinolinolato)aluminum(III)-$\mu$-oxo-bis(2-methyl-4-methoxyquinolinolato)aluminum(III), bis(5-cyano-2-methyl-8-quinolinolato)aluminum(III)-$\mu$-oxo-bis(5-cyano-2-methyl-8-quinolinolato)aluminum(III), and bis(2-methyl-5-trifluoromethyl-8-quinolinolato) aluminum(III)-$\mu$-oxo-bis(2-methyl-5-trifluoromethyl-8-quinolinolato)aluminum(III).

Other useful host materials are the phenylanthracene derivatives described in JP-A 12600/1996 and the tetraarylethene derivatives described in JP-A 12969/1996.

The light emitting layer may also serve as the electron injecting and transporting layer. In this case, tris(8-quinolinolato)aluminum etc. are preferably used. These fluorescent materials may be evaporated.

Also, if necessary, the light emitting layer may also be a layer of a mixture of at least one hole injecting and transporting compound and at least one electron injecting and transporting compound, in which a dopant is preferably contained. In such a mix layer, the content of the dopant is preferably 0.01 to 20% by weight, especially 0.1 to 15% by weight.

In the mix layer, carrier hopping conduction paths are created, allowing carriers to move through a polarly predominant material while injection of carriers of opposite polarity is rather inhibited, and the organic compound becomes less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from compounds for the hole transporting layer and compounds for the electron injecting and transporting layer to be described later, respectively. Inter alia, the compound for the hole transporting layer is preferably selected from amine derivatives having strong fluorescence, for example, triphenyldiamine derivatives which are hole transporting materials, styrylamine derivatives and amine derivatives having an aromatic fused ring.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

For the hole transporting layer, amine derivatives having intense fluorescence are useful, for example, the triphenyldiamine derivatives, styrylamine derivatives, and amine derivatives having an aromatic fused ring, exemplified above as the hole transporting material.

The mix ratio is preferably determined in accordance with the carrier density and carrier mobility. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer, specifically from 1 to 85 nm, more preferably 5 to 60 nm, especially 5 to 50 nm.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

In the hole transporting layer, there may be used various organic compounds as described, for example, in JP-A 295695/1988, 191694/1990, 792/1991, 234681/1993, 239455/1993, 299174/1993, 126225/1995, 126226/1995, and 100172/1996, and EP 0650955A1. Exemplary are tetraarylbenzidine compounds (triaryldiamines or triphenyldiamines: TPD), aromatic tertiary amines, hydrazone derivatives, carbazole derivatives, triazole derivatives, imidazole derivatives, oxadiazole derivatives having an amino group, and polythiophenes. Two or more of these compounds may be used, and on such combined use, they may be formed as separate layers or mixed.

Where the hole injecting and transporting layer is formed separately as a hole injecting layer and a hole transporting layer, two or more compounds are selected in a proper combination from the compounds commonly used in hole injecting and transporting layers. In this regard, it is preferred to laminate layers in such an order that a layer of a compound having a lower ionization potential may be disposed adjacent the hole injecting electrode (ITO). It is also preferred to use a compound having good thin film forming ability at the hole injecting electrode surface. The order of lamination also applies where a plurality of hole injecting and transporting layers are provided. Such an order of lamination is effective for lowering the drive voltage and preventing current leakage and the development and growth of dark spots. Since evaporation is utilized in the manufacture of devices, films as thin as about 1 to 10 nm can be formed uniform and pinhole-free, which restrains any change in color tone of light emission and a drop of efficiency by re-absorption even if a compound having a low ionization potential and absorption in the visible range is used in the hole injecting layer. Like the light emitting layer, the hole injecting and transporting layer may be formed by evaporating the above-mentioned compounds.

In the electron injecting and transporting layer which is optionally provided, there may be used quinoline derivatives including organic metal complexes having 8-quinolinol or a derivative thereof as a ligand such as tris(8-quinolinolato) aluminum (Alq3), oxadiazole derivatives, perylene derivatives, pyridine derivatives, pyrimidine derivatives, quinoxaline derivatives, diphenylquinone derivatives, and nitro-substituted fluorene derivatives. The electron injecting and transporting layer can also serve as the light emitting layer. In this case, use of tris(8-quinolinolato)aluminum etc. is preferred. Like the light emitting layer, the electron injecting and transporting layer may be formed by evaporation or the like.

Where the electron injecting and transporting layer is formed separately as an electron injecting layer and an electron transporting layer, two or more compounds are selected in a proper combination from the compounds commonly used in electron injecting and transporting layers. In this regard, it is preferred to stack layers in such an order that a layer of a compound having a greater electron affinity may be disposed adjacent the electron injecting electrode. The order of stacking also applies where a plurality of electron injecting and transporting layers are provided.

The substrate may be provided with a color filter film, a fluorescent material-containing color conversion film or a dielectric reflecting film for controlling the color of light emission.

The color filter film used herein may be a color filter as used in liquid crystal displays and the like. The properties of a color filter may be adjusted in accordance with the light emission of the organic EL device so as to optimize the extraction efficiency and color purity. It is also preferred to use a color filter capable of cutting external light of short wavelength which is otherwise absorbed by the EL device materials and fluorescence conversion layer, because the light resistance and display contrast of the device are improved. An optical thin film such as a multilayer dielectric film may be used instead of the color filter.

The fluorescence conversion filter film is to convert the color of light emission by absorbing electroluminescence and allowing the fluorescent material in the film to emit light. It is formed from three components: a binder, a fluorescent material, and a light absorbing material. The fluorescent material used may basically have a high fluorescent quantum yield and desirably exhibits strong absorption in the electroluminescent wavelength region. In practice, laser dyes are appropriate. Use may be made of rhodamine compounds, perylene compounds, cyanine compounds, phthalocyanine compounds (including subphthalocyanines), naphthalimide compounds, fused ring hydrocarbon compounds, fused heterocyclic compounds, styryl compounds, and coumarin compounds. The binder is selected from materials which do not cause extinction of fluorescence, preferably those materials which can be finely patterned by photolithography or printing technique. Also, where the filter film is formed on the substrate so as to be contiguous to the hole injecting electrode, those materials which are not damaged during deposition of the hole injecting electrode (such as ITO or IZO) are preferable. The light absorbing material is used when the light absorption of the fluorescent material is short and may be omitted if unnecessary. The light absorbing material may also be selected from materials which do not cause extinction of fluorescence of the fluorescent material.

In forming the hole injecting and transporting layer, the light emitting layer, and the electron injecting and transporting layer, vacuum evaporation is preferably used because homogeneous thin films are available. By utilizing vacuum evaporation, there is obtained a homogeneous thin film which is amorphous or has a crystal grain size of less than 0.1 µm. If the grain size is more than 0.1 µm, uneven light emission would take place and the drive voltage of the device must be increased with a substantial drop of hole injection efficiency.

The conditions for vacuum evaporation are not critical although a vacuum of $10^{-4}$ Pa or lower and a deposition rate of about 0.01 to 1 nm/sec. are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, boats having the compounds received therein are individually temperature controlled to achieve co-deposition.

The organic EL device of the invention is generally of the dc drive type while it can be of the ac or pulse drive type. The applied voltage is generally about 2 to 20 volts.

EXAMPLE

Examples of the present invention are given below by way of illustration and not by way of limitation.

Example 1

A glass substrate was dimensioned 100 mm×100 mm×0.7 mm thick and composed of, in % by weight, 70% of $SiO_2$, 15% of $Na_2O$, 3% of $Al_2O_3$, 10% of CaO, and 2% of MgO.

By RF sputtering using a target of $SiO_2$, a barrier layer was deposited on the glass substrate at a deposition rate of 10 nm/min. to a thickness of 30 nm. The sputtering gas used was a mixture of 100 sccm of argon and 10 sccm of oxygen ($O_2$). Sputtering conditions included room temperature, an operating pressure of 0.5 Pa, an input power of 500 W at a frequency of 13.56 MHz, and a substrate-to-target distance of 5 cm. The barrier layer as deposited had a composition of $SiO_{2.01}$ and a refractive index of 1.45 at a wavelength of 632 µm.

Next, a transparent ITO electrode (or hole injecting electrode) was deposited to a thickness of 85 nm and patterned so as to define pixels in a matrix of 64 dots×7 lines (each pixel sized 280×280 µm). The substrate having the patterned hole injecting electrode was subjected to ultrasonic washing with neutral detergent, acetone, and ethanol, pulled up from boiling ethanol, and dried. The surface was further cleaned with UV/ozone.

Thereafter, the substrate was secured by a holder in a vacuum evaporation chamber, which was evacuated to a vacuum of $1\times10^{-4}$ Pa or lower. 4,4',4"-tris(N-(3-methylphenyl)-N-phenylamino)triphenylamine (m-MTDATA) was evaporated at a deposition rate of 0.2 nm/sec. to a thickness of 40 nm, forming a hole injecting layer. With the vacuum kept, N,N'-diphenyl-N,N'-m-tolyl-4,4'-diamino-1,1'-biphenyl (TPD) was evaporated at a deposition rate of 0.2 nm/sec. to a thickness of 35 nm, forming a hole transporting layer. With the vacuum kept, tris(8-quinolinolato)aluminum (Alq3) was evaporated at a deposition rate of 0.2 nm/sec. to a thickness of 50 nm, forming an electron injecting and transporting/light emitting layer. These organic layers had an overall thickness of 130 nm.

Next, the EL device substrate was transferred from the vacuum evaporation chamber to a sputtering apparatus. By dc sputtering using a target of Ag—Mg, a cathode or an electron injecting electrode was deposited at a deposition rate of 10 nm/min. to a thickness of 150 nm. The sputtering gas used was Ar. Sputtering conditions included a pressure of 1 Pa, an input power of 100 W, and a substrate-to-target distance of 80 mm.

With the vacuum kept, by dc sputtering using an aluminum target under a pressure of 0.3 Pa, a protective electrode of aluminum was deposited to a thickness of 200 nm. The sputtering gas used was Ar. Sputtering conditions included an input power of 500 W, a target diameter of 4 inches, and a substrate-to-target distance of 90 mm.

Finally, using an adhesive and spacer of the predetermined size, a sealing glass plate was joined to the device for sealing.

With a dc voltage applied in the ambient atmosphere, the organic EL device thus obtained was driven at a constant current density of 10 mA/cm². In the initial stage, no dark spots were observed. The device was stored under accelerating conditions including a temperature of 60° C. and a humidity of 95%. The device was evaluated for deterioration by measuring the time taken until dark spots grew to 100 µm. The results are shown in Table 1.

Example 2

An organic EL device was prepared as in Example 1 except that the flow rate of $O_2$ in the sputtering gas during deposition of the barrier layer was changed. The resulting barrier layer had a composition of $SiO_{1.95}$ and a refractive index of 1.47 at a wavelength of 632 nm. The device was evaluated as in Example 1, with the results shown in Table 1.

Comparative Example 1

An organic EL device was prepared as in Example 1 except that the barrier layer was not formed. The device was evaluated as in Example 1, with the results shown in Table 1.

Comparative Example 2

An organic EL device was prepared as in Example 1 except that the flow rate of $O_2$ in the sputtering gas during deposition of the barrier layer was changed. The resulting barrier layer had a composition of $SiO_{2.23}$ and a refractive index of 1.38 at a wavelength of 632 nm. The device was evaluated as in Example 1, with the results shown in Table 1.

TABLE 1

| Example | SiOx x | Refractive index n | Growth time of 100 µm dark spot (hr) |
|---|---|---|---|
| E1 | 2.01 | 1.45 | >300 |
| E2 | 1.95 | 1.47 | >300 |
| CE1 | — | — | 5 |
| CE2 | 2.23 | 1.38 | 30 |

As is evident from Table 1, the organic EL devices within the scope of the invention are retarded from generating and growing dark spots and thus improved in storage stability and durability.

There has been described an organic EL device having a silicon oxide base barrier layer between a substrate and an organic EL structure which despite the use of alkali glass as the substrate, has advantages including restrained occurrence or growth of dark spots, improved storage stability and durability, and reduced expense of manufacture.

The invention has been described in detail with particular reference to preferred embodiments thereof, but it will be understood that variations and modifications can be effected within the spirit and scope of the invention.

What is claimed is:

1. An organic electroluminescent device comprising a substrate of alkali glass, an organic electroluminescent structure on the substrate, and a barrier layer between said substrate and said organic electroluminescent structure, said barrier layer containing silicon oxide having a refractive index of 1.40 to 1.55 at a wavelength of 632 nm, wherein said substrate contains 10 to 30 % by weight, calculated as $Na_2O$ and $K_2O$, of sodium or potassium or a mixture of sodium and potassium, and wherein said barrier layer has been formed by sputtering.

2. The organic electroluminescent device of claim 1 wherein said silicon oxide is represented by SiOx wherein x is from 1.8 to 2.2.

3. The organic electroluminescent device of claim 1 wherein said barrier layer has a thickness of 5 to 50 nm.

4. The organic electroluminescent device of claim 1 wherein said barrier layer has a mean surface roughness (Ra) of 2 to 50 nm.

5. The organic electroluminescent device of claim 1 wherein said substrate has a mean surface roughness (Ra) of 2 to 50 nm.

6. The organic electroluminescent device of claim 1 wherein said substrate has been mirror polished.

7. An organic electroluminescent device comprising a substrate of alkali glass, an organic electroluminescent structure on the substrate, and a barrier layer between said substrate and said organic electroluminescent structure, said barrier layer containing silicon oxide represented by SiOx wherein x is from 1.8 to 2.2.

* * * * *